US012045958B2

(12) United States Patent
Chen et al.

(10) Patent No.: US 12,045,958 B2
(45) Date of Patent: Jul. 23, 2024

(54) MOTION ARTIFACT CORRECTION USING ARTIFICIAL NEURAL NETWORKS

(71) Applicant: Shanghai United Imaging Intelligence Co., Ltd., Shanghai (CN)

(72) Inventors: Xiao Chen, Lexington, MA (US); Shuo Han, Baltimore, MD (US); Zhang Chen, Brookline, MA (US); Shanhui Sun, Lexington, MA (US); Terrence Chen, Lexington, MA (US)

(73) Assignee: Shanghai United Imaging Intelligence Co., Ltd., Shanghai (CN)

( * ) Notice: Subject to any disclaimer, the term of this patent is extended or adjusted under 35 U.S.C. 154(b) by 467 days.

(21) Appl. No.: 17/378,448

(22) Filed: Jul. 16, 2021

(65) Prior Publication Data

US 2023/0019733 A1 Jan. 19, 2023

(51) Int. Cl.
*G06T 5/70* (2024.01)
*G01R 33/48* (2006.01)
*G01R 33/565* (2006.01)
*G06T 7/00* (2017.01)

(52) U.S. Cl.
CPC ............ *G06T 5/70* (2024.01); *G01R 33/4818* (2013.01); *G01R 33/56509* (2013.01); *G06T 7/0014* (2013.01); G06T 2207/10088 (2013.01); G06T 2207/20081 (2013.01); G06T 2207/20084 (2013.01)

(58) Field of Classification Search
None
See application file for complete search history.

(56) References Cited

U.S. PATENT DOCUMENTS

| 8,191,359 B2 | 6/2012 | White et al. |
| 10,698,063 B2 | 6/2020 | Braun et al. |
| 2016/0324500 A1 | 11/2016 | Fan et al. |
| 2019/0101605 A1* | 4/2019 | Hyun ................ G01R 33/5608 |

(Continued)

FOREIGN PATENT DOCUMENTS

EP  3485457 B1 * 1/2021 ........... G06K 9/6256

OTHER PUBLICATIONS

Liu et al., Motion artifacts reduction in brain MRI by means of a deep residual network with densely connected multi-resolution blocks (DRN-DCMB), Magnetic Resonance Imaging, 2020.

(Continued)

*Primary Examiner* — Jiangeng Sun
(74) *Attorney, Agent, or Firm* — Zhong Law LLC

(57) ABSTRACT

Neural network based systems, methods, and instrumentalities may be used to remove motion artifacts from magnetic resonance (MR) images. Such a neural network based system may be trained to perform the motion artifact removal tasks without reference (e.g., without using paired motion-contaminated and motion-free MR images). Various training techniques are described herein including one that feeds the neural network with pairs of MR images with different levels of motion contamination and forces the neural network learn to correct the motion contamination by transforming a first image of a contaminated pair into a second image of the contaminated pair. Other neural network training techniques are also described with an aim to reduce the reliance on training data that is difficult to obtain.

18 Claims, 7 Drawing Sheets

(56) References Cited

U.S. PATENT DOCUMENTS

| | | | |
|---|---|---|---|
| 2019/0104940 A1* | 4/2019 | Zhou | G06T 11/008 |
| 2019/0167203 A1* | 6/2019 | Paul | A61B 5/7267 |
| 2019/0257905 A1* | 8/2019 | Cheng | G01R 33/5608 |
| 2019/0277935 A1* | 9/2019 | Zeng | G06T 5/70 |
| 2019/0377047 A1* | 12/2019 | Chen | G01R 33/5608 |
| 2020/0011951 A1* | 1/2020 | Shi | G01R 33/56536 |
| 2020/0049785 A1* | 2/2020 | Liu | A61B 5/055 |
| 2020/0058106 A1* | 2/2020 | Lazarus | G01R 33/5608 |
| 2020/0105031 A1* | 4/2020 | Cheng | G06N 3/084 |
| 2020/0311878 A1* | 10/2020 | Matsuura | G06V 10/82 |
| 2021/0012543 A1* | 1/2021 | Hein | G06T 11/005 |
| 2021/0223343 A1* | 7/2021 | Koerzdoerfer | G01R 33/4828 |

OTHER PUBLICATIONS

Haskell et al., 2019, Network Accelerated Motion Estimation and Reduction (NAMER): Convolutional neural network guided retrospective motion correction using a separable motion model, 2019.

Tamada et al., Motion Artifact Reduction Using a Convolutional Neural Network for Dynamic Contrast Enhanced MR Imaging of the Liver, 2019.

Lyu et al., Cine Cardiac MRI Motion Artifact Reduction Using a Recurrent Neural Network, 2020.

Lehtinen et al, Noise2noise, Learning Image Restoration without Clean Data, Mar. 2018.

Ulyanov et al., Deep Image Prior, Feb. 2020.

Quan et al., Self2Self With Dropout: Learning Self-Supervised Denoising From Single Image, 2020.

Liao et al., Artifact Disentanglement Network for Unsupervised Metal Artifact Reduction, Jun. 2019.

\* cited by examiner

MOTION ARTIFACT CORRECTION USING ARTIFICIAL NEURAL NETWORKS

BACKGROUND

Motion artifacts such as those caused by patient bulk movements are commonly seen in Magnetic Resonance Imaging (MRI) procedures, especially those involving a dynamic scan subject. Using cardiac MRI as an example, the images captured are often contaminated by artifacts arising from respiratory movements, blood flow, and other types of motions of the patient. It has been reported that about 20% of repeated MRI scans are attributable to motion artifacts, which imposes significant burdens on hospitals and other medical facilities. In recent years, deep learning based techniques have brought great progress to MRI image analysis and post-processing, but motion artifact removal remains a challenging task. A major roadblock is the lack of training data. Motion contaminated images are usually discarded after scanning, and it is even harder to collect data with controlled motions, such as image pairs consisting of clean and motion-contaminated images, that can be used for supervised learning.

On the other hand, many MRI applications involve acquiring multiple MR images within one scan. For example, in cardiac cine MRI, a time series of images are acquired to record the contraction movements of the heart; in T1 mapping, multiple images are captured to record the T1 relaxation process of different tissues. These inter-related images often include valuable information indicative of the source and extent of motion artifacts, and may offer key insights into how to remove those motion artifacts. Deep learning based image processing systems that utilize multiple inter-related images for motion artifact correction, however, are lacking.

SUMMARY

Described herein are systems, methods, and instrumentalities associated with removing (e.g., correcting or reducing) motion artifacts from magnetic resonance (MR) images using an artificial neural network (ANN). The ANN may learn parameters (e.g., an artifact removal model) associated with the motion artifact removal through a training process. The learning may be performed with a training network and using a training dataset that comprises a plurality of paired MR images containing different motion artifacts, without referencing a corresponding motion-free image. Each pair of MR images of the training dataset may comprise a first MR image comprising a first motion artifact and a second MR image comprising a second motion artifact. The first and second motion artifacts may be randomly generated, for example, based on computer simulation or patient motions.

During the learning, the training network may, for each pair of MR images, produce an output image based on the first MR image of the pair of MR images to resemble the second MR image of the pair of MR images. The training network may determine a difference between the output image and the second MR image of the pair of MR images and adjust one or more of parameters of the training network with an objective of minimizing the difference. By performing the aforementioned operations on the large number of images comprised in the training dataset, the training network may exploit the randomness of the motion artifacts comprised in each pair of motion contaminated MR images to learn parameters (e.g., a machine learned model) for removing (e.g., correcting or reducing) motion artifacts from a motion contaminated MR image. These parameters of the training network may be stored upon completion of the learning process and used to implement the ANN for removing motion artifacts from practical MR images.

In examples, the motion artifacts comprised in the training dataset described herein may be simulated based on k-space data, for example, by manipulating (e.g., randomly) the order in which the k-space data is acquired. In examples, the motion artifacts comprised in the training dataset described herein may be generated based on patient motions (e.g., deep breathing) incurred during practical MRI procedures. In examples, the training dataset may comprise MR images of different scanned objects (e.g., belonging to different patients), but each pair of MR images provided to the training network may be associated with a same object (e.g., with different degrees or realizations of motion artifacts).

Other network training techniques associated with reference-less (e.g., unsupervised) learning are also described herein including, for example, providing multiple MR images (e.g., comprised in a cine movie) as inputs (e.g., different input channels) to the network and forcing the network to learn the connections among the multiple images, for example, by applying linear or fully connected operations to the time frames associated with the multiple images.

BRIEF DESCRIPTION OF THE DRAWINGS

A more detailed understanding of the examples disclosed herein may be obtained from the following description, given by way of example in conjunction with the accompanying drawing.

DETAILED DESCRIPTION

The present disclosure is illustrated by way of example, and not by way of limitation, in the figures of the accompanying drawings.

Figure 1:
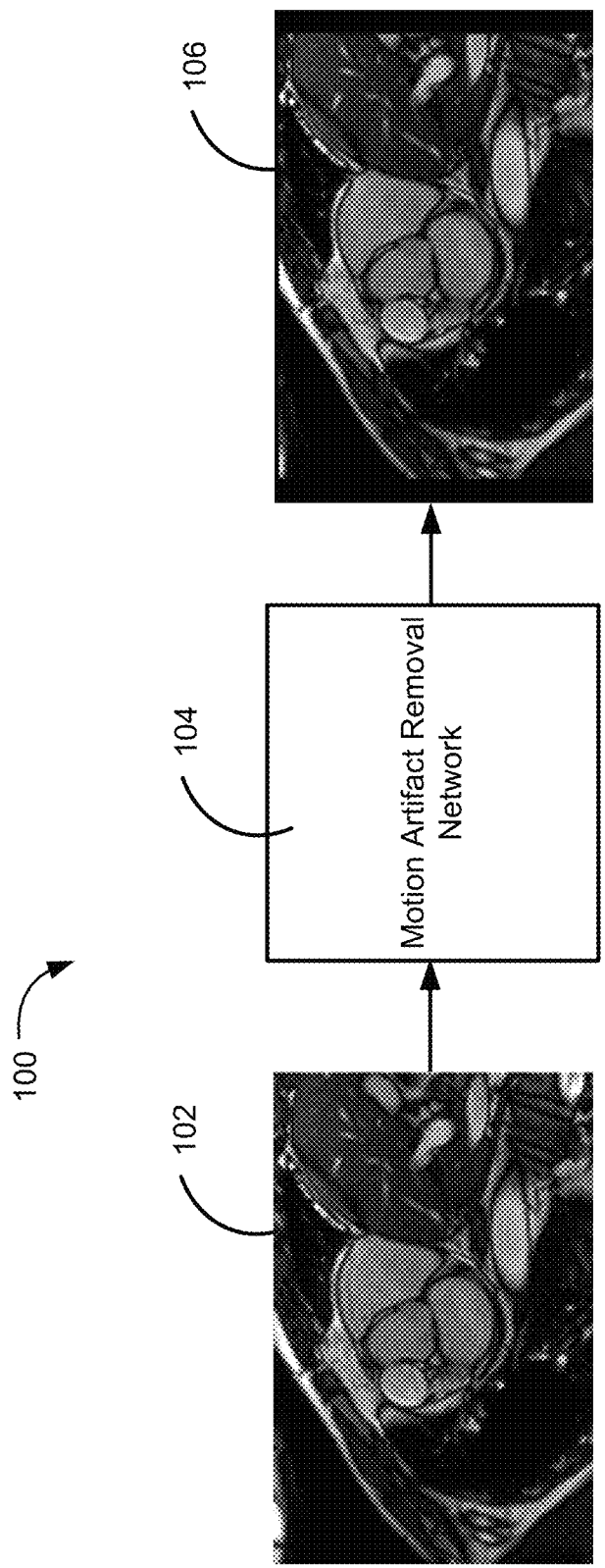
FIG. 1 is a block illustrating an example neural network system for removing (e.g., correcting) motion artifacts in magnetic resonance (MR) images.

FIG. 1 is a block diagram illustrating an example neural network system 100 (e.g., a motion artifact removal apparatus) for removing (e.g., correcting or reducing) motion artifacts in an magnetic resonance (MR) image. As shown, the system 100 may take a motion contaminated MR image 102 as an input, process the image using a neural network (e.g., one or more neural networks) 104 trained for motion artifact removal, and produce an MR image 104 (e.g., of a similar size as the input image 102) that is substantially free of (e.g., with substantially reduced) motion artifacts compared to the MR image 102. The MR image 102 may include a single image or a cine video (e.g., comprising multiple MR images) that may be obtained from various sources such as, e.g., a magnetic resonance imaging (MRI) device, a database storing patient imaging records, etc. The motion artifacts comprised in the MR image 102 may have different causes including patient movements, device errors, etc. For example, the motion artifacts contained in MR image 102 may include artifacts caused by patient bulk movements such as respiratory motions, irregular heartbeats, signal collection errors (e.g., hardware glitches), etc.

The neural network 104 may include one or more convolutional neural networks (CNNs) trained to correct (e.g., remove) the motion artifacts from the MR image 102. The neural network 104 may include one or more convolutional layers each comprising a plurality of kernels or filters configured to identify artifact components from the MR image 102 via one or more convolution operations. Each kernel or filter may be associated with a respective set of weights that may be optimized through a training process for extracting specific features from the MR image 102. The convolution operations may be followed by batch normalization and/or linear or non-linear activation (e.g., using one or more rectified linear units (ReLU)) to separate image features (e.g., non-artifact) features from noisy features (e.g., artifacts). For example, the neural network 104 may include a first convolutional layer having multiple (e.g., 64) filters with a kernel size of 3×3 and a ReLU as an activation function. The neural network 104 may include multiple middle layers (e.g., additional convolutional layers after the first convolutional layer) and each of these middle layers may include a similar number of filters (e.g., 64 filters with a kernel size of 3×3), followed by batch normalization and ReLU. The neural network 104 may include an additional convolutional layer (e.g., a last layer before the output) that utilizes filters of similar kernel size (e.g., 3×3) to construct an output image that represents a clean version (e.g., substantially free of motion artifacts) of the MR image 102 or the artifacts contained in the MR image 102. In the latter case, an artifact-free or artifact-reduced image (e.g., the MR image 106) may be generated by subtracting the predicted output image from the MR image 102.

In examples, the neural network 104 may include an encoder configured to extract, e.g., via a plurality of convolution operations, image features at multiple spatial resolution levels, and/or a decoder configured to decode the image features to generate the output image 106. In examples, the neural network 104 may include a recurrent neural network (RNN), for example, when multiple images are received at the input.

The motion artifact removal neural network described herein (e.g., the neural network 104 in FIG. 1) may be trained using techniques that do not require having training images with controlled motions (e.g., pairs of clean and contaminated images, the acquisition of which may require specifically designed sequences, prolonged scan time, patient cooperation, technician experience, etc.). Rather, the training of the motion artifact removal neural network may be conducted using pairs of motion contaminated images (e.g., different pairs of images may be associated with different scanned objects, but each image pair used during an iteration of the training may include the same underlying object but with different types or severities of motion artifacts). These images may be obtained from practical MRI procedures in which motion contaminations occurred (e.g., due to patient movements) or be computer simulated or otherwise artificially created. For example, the motion artifacts may be randomly introduced during an MR acquisition sequence, such as by manipulating (e.g., altering) the order in which k-space data is acquired (e.g., the order in which k-space is covered), and/or by simulating multiple acquisitions to generate randomly perturbed artifacts. As another example, the motion artifacts may be introduced by instructing patients during MRI scan procedures to make certain motions (e.g., heavy breathing motions) at different stages of the procedures. As yet another example, the motion artifacts may be simulated based on underlying images that may or may not contain artifacts and by adding artificial noises to the underlying images (e.g., based on a parameterized model that simulates respiratory motions). In any of these techniques, the artifact simulation may be performed using parameters that allow for randomly varying the severity or type of artifacts to be introduced, or the manner in which the artifacts are realized. These parameters may include, for instance, the number of indices of phase encoding lines that may be affected by motion, the direction and/or magnitude of a motion, etc. As a result, the motion artifacts generated therefrom may have structured appearances but random causes or realizations.

Figure 2:
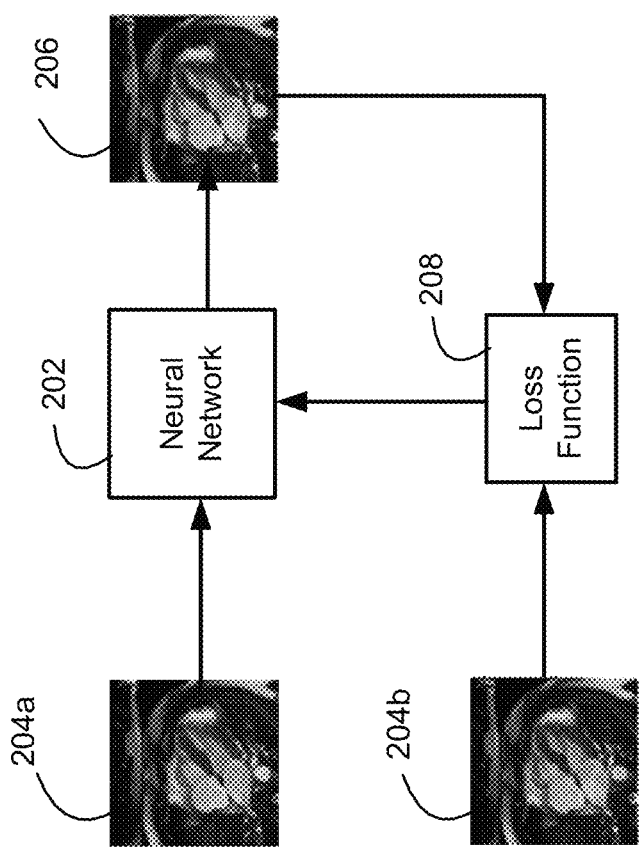
FIG. 2 is a block diagram illustrating an example of using pairs of motion contaminated MR images to train a neural network for motion artifact removal.

During the training of the neural network, the motion contaminated MR training images described herein may be arranged in pairs, for example, with each pair having the same scanned object but different motion artifacts (e.g., randomly generated artifacts), and provided to the neural network for processing. FIG. 2 illustrates example operations of a neural network 202 during such a training process. As shown, in one or more training iterations, the neural network 202 may receive an input MR image 204a that may be a part of a motion contaminated image pair. The motion contaminated image pair may be selected such that the input MR image 204a and a second MR image 204b of the pair are associated with a same scanned object (e.g., a same anatomical structure of a patient) but contain different numbers, types, or severities of motion artifacts. The neural network 202 may process the input MR image 204a (e.g., via one or more convolution, batch normalization, and/or activation operations) to generate an output image 206 to resemble the other image 204b of the motion contaminated image pair. The neural network 202 may then determine a difference between the output image 206 and the image 204b, for example, in accordance with a loss function 208 (e.g., various loss functions may be used for this purpose including, for example, L1, L2, mean squared errors (MSE), structural similarity index measure (SSIM), etc.) Based on the determined difference, the neural network 202 may adjust one or more of its operating parameters (e.g., weights associated with the neural network) via a backpropagation process (e.g., using a gradient descent associated with the loss function), with an objective to minimize the difference between the output image 206 and the image 204b.

Using the approach described herein, the variance of the artifacts/noises in the estimate (e.g., the output image 206) produced by the neural network 202 may be inversely proportional to the number of images used to train the neural network 202. Therefore, the error in motion removal or correction may approach zero with a sufficiently large number of training images. In other words, from a large training dataset with randomly generated motion artifacts, the neural network 202 may learn and maintain the consistent information comprised in the training images (e.g., imagery information without the random artifacts). For example, let A represent the underlying artifact-free object and $R(A, \varepsilon_i)$ represent a real image of the object (where $\varepsilon_i$ may represent the random motion artifacts introduced into the image by a random function R), then the neural network described herein may be used to derive B=G{R(A, $\varepsilon_i$), θ}, where G may represent a prediction or mapping (e.g., denoising operations) performed by the network, θ may be the network's parameters, and B may be the output of the network. The training of the neural network may then be conducted utilizing a loss function to minimize the difference between A and B (e.g., which may contain one or more other artifacts). Such a loss function may be based on L2, L1, structural similarity index measure (SSIM), and/or one or more other principles. Thus, when trained using such a loss function and a large number of image pairs (R(A,$\varepsilon_i$), R(A, $\varepsilon_j$)), the mapping G may be able to keep only the information that makes A=G{R(A, $\varepsilon_i$), θ}.

The motion artifact removal neural network described herein (e.g., the neural network 104 in FIG. 1) may also be trained using techniques that exploit information across multiple inter-related images (e.g., from a cine movie). These images may be acquired within one scan and as a result there may be connections (e.g., interrelationships) among the images (e.g., along the time axis) that may be utilized to guide the removal or correction of motion artifacts. Techniques that treat the time dimension as an additional spatial dimension (e.g., using convolutional kernels) may not be suitable for these images since motion artifacts may span across multiple image frames and the field of reception of a convolutional neural network may be limited. The benefits of a recurrent neural network may also be limited in these situations, for example, because the connection between image frame that are further away in time may be difficult to learn. To improve the accuracy and effectiveness of motion artifact correction, the motion artifact removal neural network described herein may be trained to receive a video (e.g., a cine movie) at the input and learn the connections among different images of the video by performing one or more linear or fully-connected operations along the timeline of the images. In examples, the multiple images may be stacked and the number of images may determine the number of channels that are included the input matrix to the neural network. Through training (e.g., which may be performed unsupervised (without reference) or supervised (with reference)), the motion artifact removal neural network may learn a time-specific interaction for each individual image frame (e.g., the weights with respect to other images may be different for each time point), and the performance of the motion artifact removal operations may be improved as a result, e.g., at least for those motion artifacts associated with information that is further away in time, by exploiting the spatial-temporal correlations in the time series of the images.

Figure 3A:
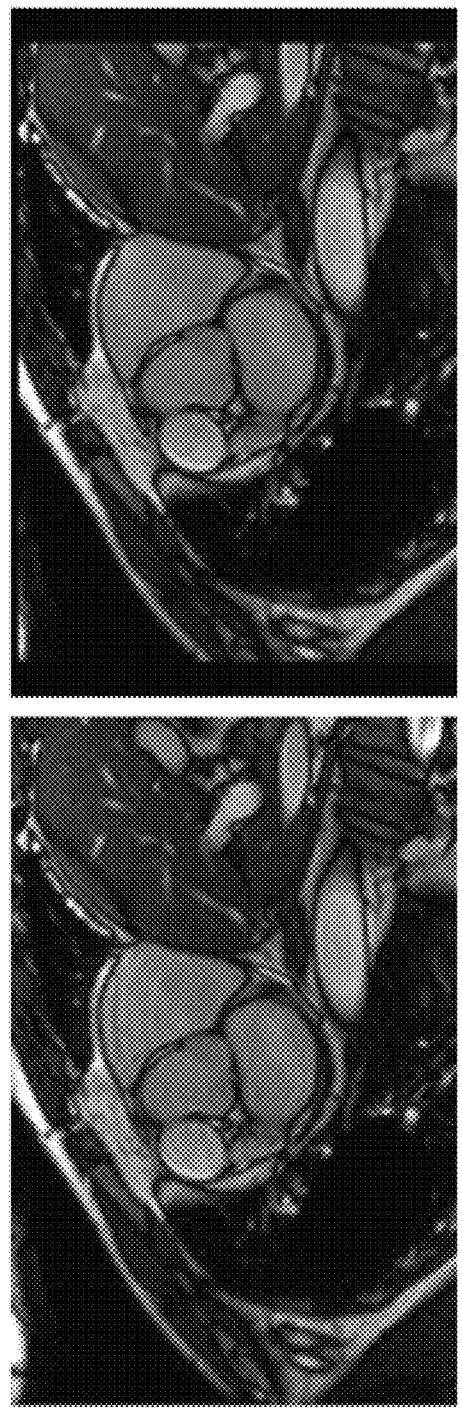
FIGS. 3A, 3B and 3C illustrate example results that may be produced by a motion artifact removal neural network as described herein.
Figure 3B:
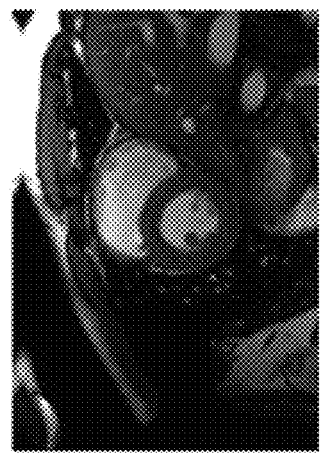
Figure 3B:
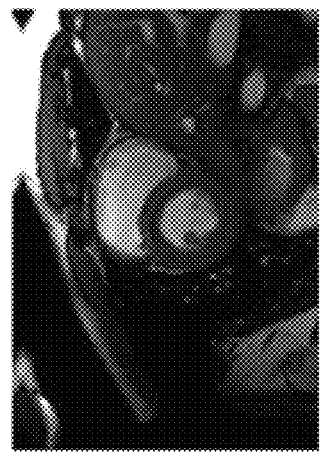
Figure 3B:
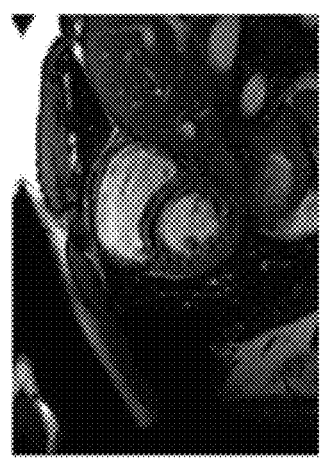
Figure 3C:
Figure 3C:
Figure 3C:

FIGS. 3A, 3B, and 3C show example results that may be produced by a motion artifact removal neural network trained using the techniques described herein. The left image in FIG. 3A is a motion contaminated image to be corrected and the right image in the figure shows motion correction results produced by a neural network trained using motion contaminated image pairs, as described herein. The left-most image in FIG. 3B is a motion contaminated image to be corrected, the middle image in the figure shows motion removal results produced by a neural network trained using single images or frames as input, and the right-most image in the figure shows motion correction produced by a neural network trained using multiple inter-related images or frames at the input, as described herein. Similarly, the left-most image in FIG. 3C is a motion contaminated image to be corrected, the middle image in the figure shows motion correction results produced by a neural network (e.g., a CNN) trained using conventional techniques, and the right-most image in the figure shows motion correction produced by a neural network trained using multiple inter-related images or frames at the input, as described herein.

Figure 4:
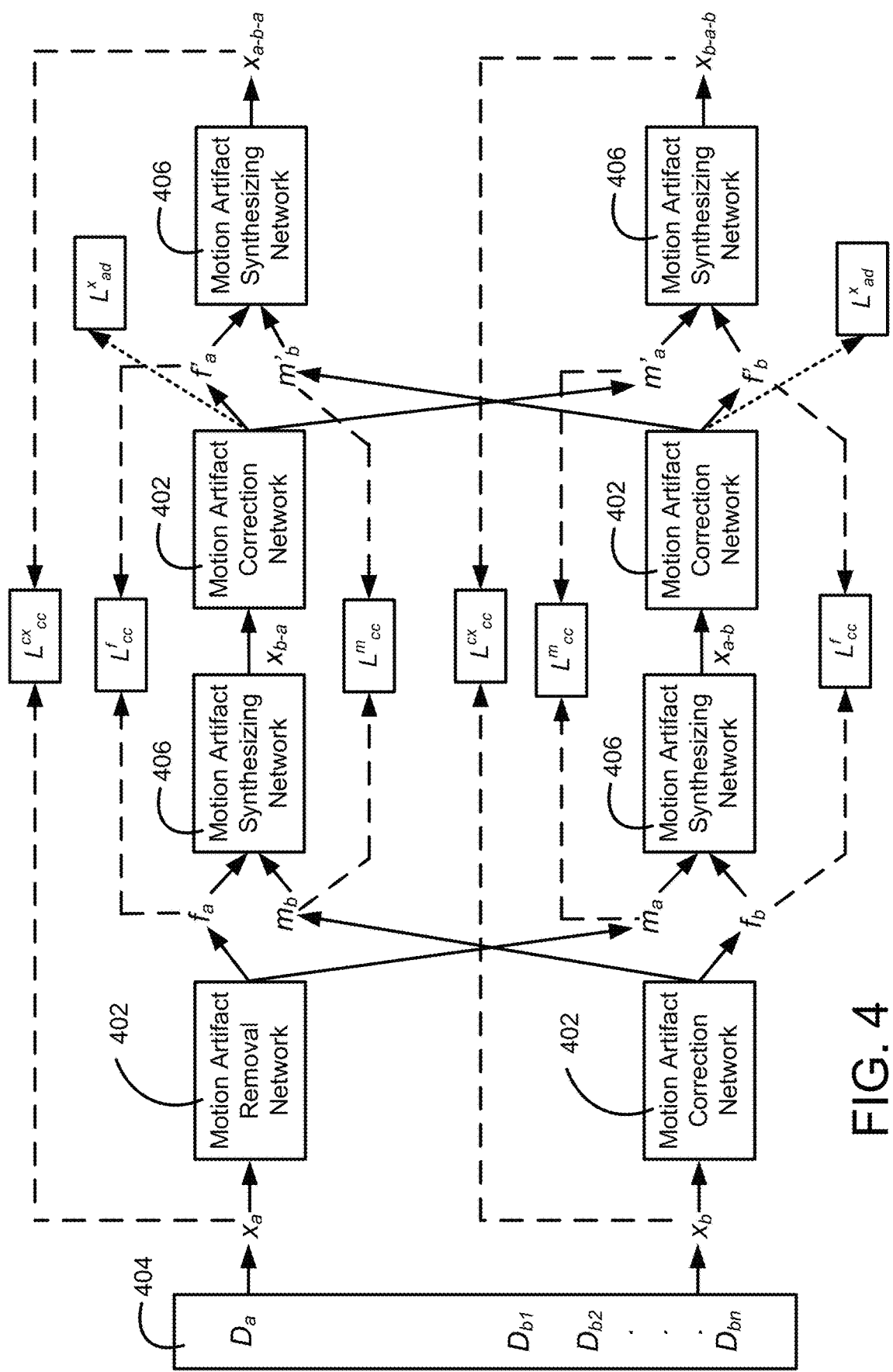
FIG. 4 is a block diagram illustrating example techniques for training a motion artifact removal network based on domain transferring.

FIG. 4 illustrates another example technique for training a motion artifact removal (e.g., correction) network 402 (e.g., the neural network 104 in FIG. 1). The image set 404 used for the training may include routine MR images collected from clinical settings (e.g., with no special manipulation or arrangements). These clinical images may contain a wide range of motion artifact types and/or severity, but may also include motion-free images. To prepare for the training, the image set 404 may be divided into multiple groups including, for example, a motion-free group and a motion-contaminated group. The motion-contaminated group may be further divided into sub-groups, where each sub-group may include images having a certain severity of motion contaminations. The grouping of the images may be performed manually (e.g., by medical professionals) or automatically (e.g., by computing programs) or using a combination of manual and automatic techniques. The images in the different groups may include different scanned objects (e.g., different tissues) belonging to the same patient or to different patients.

The training may be performed in an unsupervised manner during which the motion artifact removal network 402 may learn a model for removing or reducing motion artifacts from an MR image by transferring (e.g., converting) the training images 404 from one domain (e.g., the motion-contaminated group) to another domain (e.g., the motion-free group). As shown in FIG. 4, $D_a$ may represent a motion-free domain (e.g., the motion-free group), and Db may represent a motion-contaminated domain (e.g., the motion-contaminated group or a sub-group of the motion-contaminated group). A pair of images may be provided as inputs to the motion artifact removal network 402, which may be referred to herein as a first neural network. One image ($x_a$) of the pair may be selected (e.g., randomly) from $D_a$ and the other image ($x_b$) of the pair may be selected from Db. The motion artifact removal network 402 may be configured to decompose the input images into respective motion-free images (e.g., $f_a$ and $f_b$) and motion-artifact images (e.g., $m_a$ and $m_b$, which may be feature maps that contain the motion artifacts detected in the input images).

A second neural network 406 may be used to facilitate the training of the motion artifact removal neural network. This second neural network 406 may be pre-trained for synthesizing a motion-contaminated image based on a motion-free image and an image (or feature map) containing motion artifacts. As such, the second neural network 406 may also be referred to herein as motion artifact synthesizing network. As shown in FIG. 4, once the input images $x_a$ and $x_b$ are decomposed by the motion artifact removal network 402 into respective motion-free images $f_a$ and $f_b$, and motion-artifact images $m_a$ and $m_b$, the f and m associated with images $x_a$ and $x_b$ may be switched, and the motion artifact synthesizing network 406 may be used to generate respective motion contaminated images $x_{b-a}$ and $x_{a-b}$ that include the motion-free object information from $f_a$ and $f_b$, and the motion information from $m_b$ and $m_a$.

The synthesized images $x_{b-a}$ and $x_{a-b}$ may be further decomposed using the motion artifact removal network 402, and the resulting motion-free images $f'_a$ and $f'_b$ and motion-artifact images $m'_a$ and $m'_b$ may be switched again, before the motion artifact synthesizing network 406 is used to generate additional motion contaminated images $x_{a-b-a}$ and $x_{b-a-b}$ that include the motion-free object information from $f_a$ and $f_b$ and the motion information from $m'_b$ and $m'_a$. Parameters of the motion artifact removal network 402 (e.g., weights associated with various filters of the neural network) may then be adjusted based on one or more differences between the processing results. For example, the parameters of the motion artifact removal network 402 may be adjusted based on a first consistency loss ($L^f_{cc}$) between $f_a$ and $f_a$ (and/or $f_b$ and $f'_b$), a second consistency loss ($L^m_{cc}$) between $m_a$ and $m'_a$ (and/or $m_b$ and $m'_b$), and/or between a third consistency loss ($L^{cx}_{cc}$) between the input image $x_a$ and the output image $x_{a\text{-}b\text{-}a}$ (and/or the input image $x_b$ and the output image $x_{b,\_}b$). In examples, the parameters of the motion artifact removal network 402 may be further adjusted based on an adversarial loss ($L_{ad}$), for example, in the form of a binary cross-entropy loss. For instance, a discriminator may be used to differentiate "real" input images from "fake" input images generated by an image generator (e.g., such as the motion artifact synthesizing network 406) under training, and the image generator may be trained to output images that mimic the "real" input images (e.g., to fool the discriminator). Through such an adversarial process, the generator may learn to generate images that are as realistic as the "real" input images (e.g., the images generated by the generator may have the same distribution as the "real" input images).

The consistency and/or adversarial losses described herein may be determined based on respective loss functions. These loss functions may be based on, for example, mean squared errors (MSE), least absolute deviations (L1 loss), least squared errors (L2 loss), cross-entropy, SSIM, perceptual loss, etc. For instance, the adversarial loss described herein may include a binary cross-entropy loss, and the consistency loss described herein may include an SSIM loss or a VGG based perceptual loss. A same loss function may be applied to calculate all of the losses described herein, or different loss functions may be applied to calculate different losses. The adjustments to the parameters of the motion artifact removal network 402 may be implemented through a backpropagation process, for example, based on a gradient descent (e.g., a scholastic gradient descent) of the loss function employed. Greater details about the training of the motion artifact removal network 402 will be provided below. Once trained, the parameters of the motion artifact removal network 402 may be stored as the coefficients of the motion artifact removal model, which may then be used to take a motion contaminated MR image as an input, separate the object information and artifact information in the image, and produce an output image with the motion artifacts substantially removed or reduced.

Figure 5:
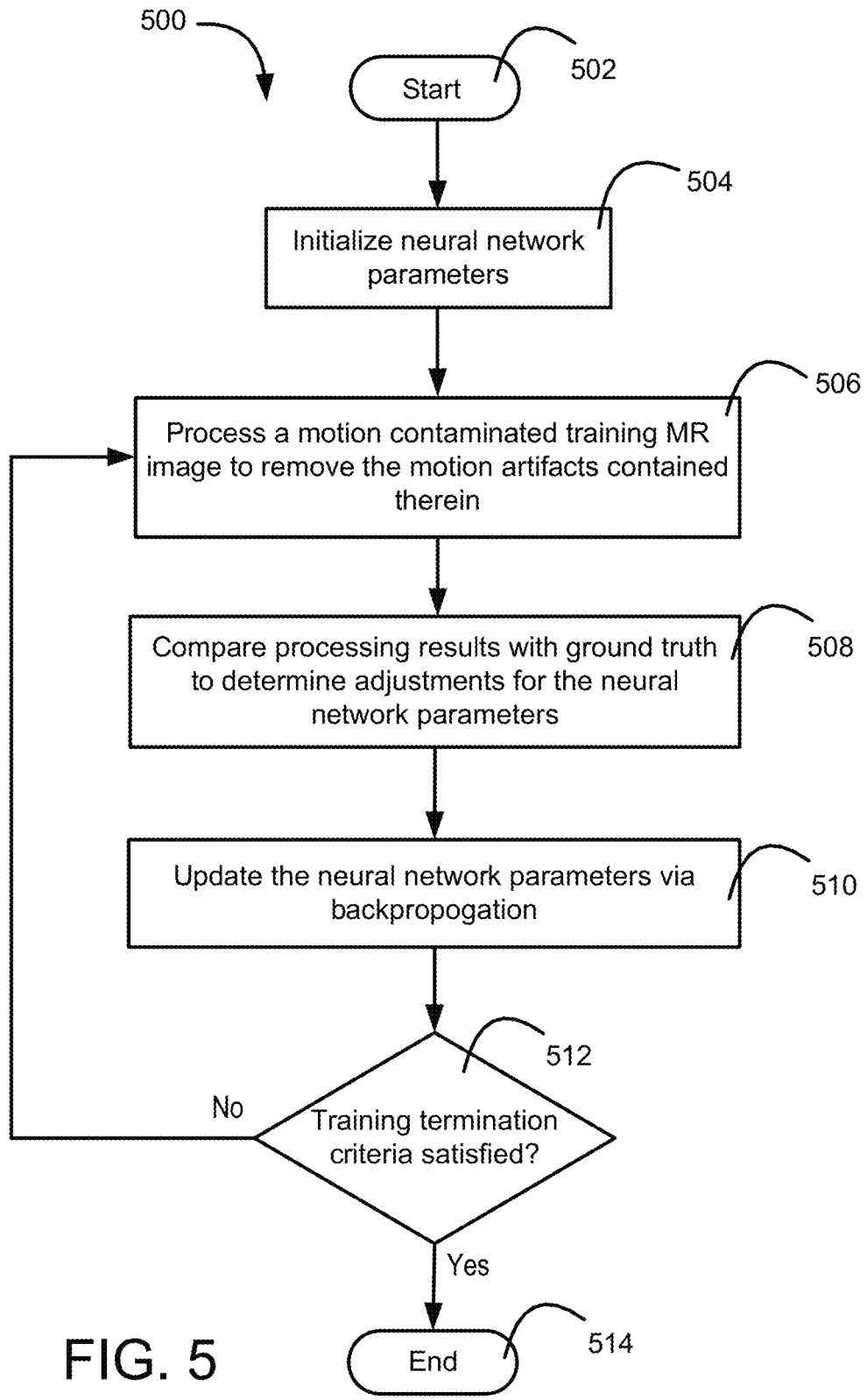
FIG. 5 is a flow diagram illustrating an example process for training a neural network system for motion artifact removal.

FIG. 5 is a flow diagram illustrating an example process 500 that may be used to train the motion artifact removal network described herein. The process 500 may start at 502 and, at 504, initial parameters of the neural network (e.g., weights associated with various filters or kernels of the neural network) may be initialized. These parameters may be initialized, for example, based on samples collected from one or more probability distributions or parameter values of another neural network having a similar architecture. At 506, the neural network may receive a motion contaminated MR image, and may process the image through the neural network to remove motion artifacts from the image (e.g., to predict a corresponding clean MR image free of the motion artifacts). At 508, the results of the processing may be compared to a reference image to determine adjustments that need to be made to the presently assigned neural network parameters. In examples, the reference image may be an image in a contaminated image pair (e.g., as illustrated by FIG. 2) or an image generated using the domain transfer techniques described herein (e.g., illustrated by FIG. 4). In examples, the reference image may be another motion contaminated image containing the same scanned object but having a different severity of motion contamination. The adjustments to the network parameters may be determined based on a loss function (e.g., based on MSE, L1 loss, L2 loss, etc.) and a gradient descent (e.g., a stochastic gradient decent) associated with the loss function.

At 510, the neural network may apply the adjustments to the presently assigned network parameters, for example, via a backpropagation process. At 512, the neural network may determine whether one or more training termination criteria are satisfied. For example, the neural network may determine that the training termination criteria are satisfied if the neural network has completed a pre-determined number of training iterations, if the difference between the processing results and the reference results is below a predetermined threshold, or if the change in the value of the loss function between two training iterations falls below a predetermined threshold. If the determination at 512 is that the training termination criteria are not satisfied, the neural network may return to 506. If the determination at 512 is that the training termination criteria are satisfied, the neural network may end the training process 500 at 514.

For simplicity of explanation, the training steps are depicted and described herein with a specific order. It should be appreciated, however, that the training operations may occur in various orders, concurrently, and/or with other operations not presented or described herein. Furthermore, it should be noted that not all operations that may be included in the training process the are depicted and described herein, and not all illustrated operations are required to be performed.

Figure 6:
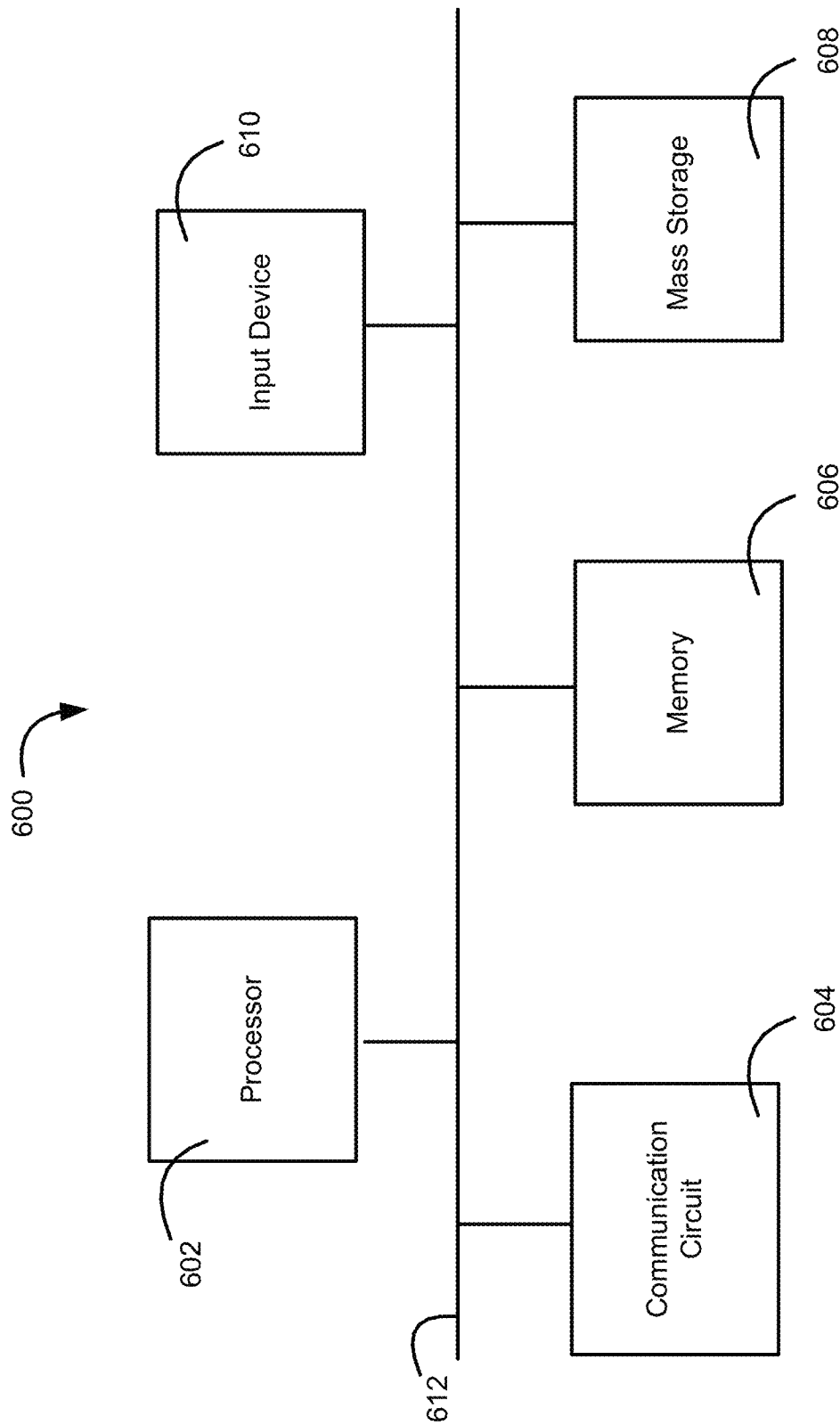
FIG. 6 is a block diagram illustrating example components of a motion artifact removal neural network system as described herein.

The systems, methods, and/or instrumentalities described herein may be implemented using one or more processors, one or more storage devices, and/or other suitable accessory devices such as display devices, communication devices, input/output devices, etc. FIG. 6 is a block diagram illustrating an example system (e.g., apparatus) 600 that may be configured to perform one or more of the functions described herein. As shown, the system 600 may include a processor (e.g., one or more processors) 602, which may be a central processing unit (CPU), a graphics processing unit (GPU), a microcontroller, a reduced instruction set computer (RISC) processor, application specific integrated circuits (ASICs), an application-specific instruction-set processor (ASIP), a physics processing unit (PPU), a digital signal processor (DSP), a field programmable gate array (FPGA), or any other circuit or processor capable of executing the functions described herein. The system 600 may further include a communication circuit 604, a memory 606, a mass storage device 608, an input device 610, and/or a communication link 612 (e.g., a communication bus) over which the one or more components shown in the figure may exchange information.

The communication circuit 604 may be configured to transmit and receive information utilizing one or more communication protocols (e.g., TCP/IP) and one or more communication networks including a local area network (LAN), a wide area network (WAN), the Internet, a wireless data network (e.g., a Wi-Fi, 3G, 4G/LTE, or 5G network). The memory 606 may include a storage medium (e.g., a non-transitory storage medium) configured to store machine-readable instructions that, when executed, cause the processor 602 to perform one or more of the functions described herein. Examples of the machine-readable medium may include volatile or non-volatile memory including but not limited to semiconductor memory (e.g., electrically programmable read-only memory (EPROM), electrically erasable programmable read-only memory (EEPROM)), flash memory, and/or the like. The mass storage device 608 may include one or more magnetic disks such as one or more internal hard disks, one or more removable disks, one or more magneto-optical disks, one or more CD-ROM or DVD-ROM disks, etc., on which instructions and/or data may be stored to facilitate the operation of the processor 602. The input device 610 may include a keyboard, a mouse, a voice-controlled input device, a touch sensitive input device (e.g., a touch screen), and/or the like for receiving user inputs to the system 600.

It should be noted that the system 600 may operate as a standalone device or may be connected (e.g., networked or clustered) with other computation devices to perform the functions described herein. And even though only one instance of each component is shown in FIG. 6, a skilled person in the art will understand that the system 600 may include multiple instances of one or more of the components shown in the figure.

The motion artifact removal techniques described herein may be used in an independent system (e.g., as part of an image post-processing procedure) to remove motion artifacts in MR images and to enhance image quality. The techniques may also be deployed as part of an on-scanner imaging pipeline. For example, the techniques may be used to reconstruct (e.g., correct) an MR image before the reconstructed image is presented to an end-user so that the end-user may directly access the motion artifact-removed image (e.g., in real time). The techniques may also be deployed outside the on-scanner imaging pipeline and as a tool for the end-user (e.g., the end-user may choose to apply the techniques to check an image with and without motion removal). The techniques may also be deployed in an integrated pipeline, for example, as a regularization step in an iterative reconstruction process.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure. In addition, unless specifically stated otherwise, discussions utilizing terms such as "analyzing," "determining," "enabling," "identifying," "modifying" or the like, refer to the actions and processes of a computer system, or similar electronic computing device, that manipulates and transforms data represented as physical (e.g., electronic) quantities within the computer system's registers and memories into other data represented as physical quantities within the computer system memories or other such information storage, transmission or display devices.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. A computer-implemented method for removing motion artifacts from a magnetic resonance (MR) image, the method comprising:

receiving a source MR image, wherein the source MR image is associated with an anatomical structure and comprises one or more motion artifacts; and processing the source MR image through an artificial neural network (ANN) to generate a target MR image that is substantially free of the one or more motion artifacts, wherein the ANN is trained to remove the one or more motion artifacts from the source MR image, and wherein the training of the ANN comprises:

obtaining a plurality of pairs of MR training images associated with the anatomical structure of a same patient, wherein each pair of obtained MR training images comprises a first MR training image and a second MR training image, wherein the first MR training image comprises a first motion artifact associated with a first type of motions or having a first severity, and wherein the second MR training image comprises a second motion artifact associated with a second type of motions or having a second severity that is equal to or greater than the first severity;

for each pair of obtained MR training images, producing, using the ANN, an output image based on the first MR training image of the pair of obtained MR training images and adjusting parameters of the ANN with an objective to minimize a difference between the output image and the second MR training image of the pair of obtained MR training images.

2. The computer-implemented method of claim 1, wherein the first motion artifact comprised in the first MR training image of each pair of obtained MR training images is associated with a patient motion and wherein the second motion artifact comprised in the second MR training image of each pair of obtained MR training images is associated with a computer-simulated motion.

3. The computer-implemented method of claim 1, wherein the second motion artifact comprised in the second MR training image of each pair of obtained MR training images has an equal or greater severity than the first motion artifact comprised in the first MR training image of each pair of obtained MR training images.

4. The computer-implemented method of claim 1, wherein both the first motion artifact comprised in the first MR training image of each pair of obtained MR training images and the second motion artifact comprised in the second MR training image of each pair of obtained MR training images are computer-simulated.

5. The computer-implemented method of claim 4, wherein the first motion artifact and the second motion artifact are simulated based on k-space data.

6. The computer-implemented method of claim 5, wherein the first motion artifact and the second motion artifact are simulated by manipulating an order in which the k-space data is acquired.

7. The computer-implemented method of claim 1, wherein the parameters of the ANN are adjusted without referencing a motion-free or motion-reduced ground truth MR image that corresponds to the first MR training image of each pair of obtained MR training images.

8. The computer-implemented method of claim 1, wherein the first motion artifact and the second motion ratification respectively comprised in the first MR training image and the second MR training image of each of the plurality of pairs of MR training images are randomly derived, and wherein the ANN learns, via the training, consistent information about the anatomical structure based on the plurality of pairs of MR training images.

9. An apparatus configured to remove motion artifacts from a magnetic resonance (MR) image, comprising:
one or more processors configured to:
receive a source MR image, wherein the source MR image is associated with an anatomical structure and comprises one or more motion artifacts; and
process the source MR image through an artificial neural network (ANN) to generate a target MR image that is substantially free of the one or more motion artifacts, wherein the ANN is trained to remove the one or more motion artifacts from the source MR image, and wherein the training of the ANN comprises:
obtaining a plurality of pairs of MR training images associated with the anatomical structure of a same patient, wherein each pair of obtained MR training images comprises a first MR training image and a second MR training image, wherein the first MR training image comprises a first motion artifact associated with a first type of motions or having a first severity, and wherein the second MR training image comprises a second motion artifact associated with a second type of motions or having a second severity that is equal to or greater than the first severity;
for each pair of obtained MR training images, producing, using the ANN, an output image based on the first MR training image of the pair of obtained MR training images and adjusting parameters of the ANN with an objective to minimize a difference between the output image and the second MR training image of the pair of obtained MR training images.

10. The apparatus of claim 9, wherein the first motion artifact comprised in the first MR training image of each pair of obtained MR training images is associated with a patient motion and wherein the second motion artifact comprised in the second MR training image of each pair of obtained MR training images is associated with a computer-simulated motion.

11. The apparatus of claim 10, wherein the second motion artifact comprised in the second MR training image of each pair of obtained MR training images has an equal or greater severity than the first motion artifact comprised in the first MR training image of each pair of obtained MR training images.

12. The apparatus of claim 9, wherein both the first motion artifact comprised in the first MR training image of each pair of obtained MR training images and the second motion artifact comprised in the second MR training image of each pair of obtained MR training images are computer-simulated.

13. The apparatus of claim 12, wherein the first motion artifact and the second motion artifact are simulated based on k-space data.

14. The apparatus of claim 13, wherein the first motion artifact and the second motion artifact are simulated by manipulating an order in which the k-space data is acquired.

15. The apparatus of claim 9, wherein the parameters of the ANN are adjusted without referencing a motion-free or motion-reduced ground truth MR image that corresponds to the first MR training image of each pair of obtained MR training images.

16. The apparatus of claim 9, wherein the first motion artifact and the second motion ratification respectively comprised in the first MR training image and the second MR training image of each of the plurality of pairs of MR training images are randomly derived, and wherein the ANN learns, via the training, consistent information about the anatomical structure based on the plurality of pairs of MR training images.

17. A method for training an artificial neural network (ANN) for removing motion artifacts from a magnetic resonance (MR) image, the method comprising:
obtaining a plurality of pairs of MR training images associated with an anatomical structure of a same patient, wherein each pair of obtained MR images comprises a first MR training image and a second MR training image, the first MR training image comprises a first randomly generated motion artifact associated with a first type of motions or having a first severity, and the second MR comprises a second randomly generated motion artifact associated with a second type of motions or having a second severity that is equal to or greater than the first severity; and
for each pair of obtained MR training images:
producing a first output image based on the first MR training image of the pair of obtained MR training images and a set of parameters of the ANN; and
adjusting the set of parameters of the ANN such that a difference between the second MR training image of the pair of obtained MR training images and a second output image produced based on the first MR training image of the pair of obtained MR training images and the adjusted set of parameters of the ANN is smaller than a difference between the second MR training image of the pair of obtained MR training images and the first output image.

18. The method of claim 17, wherein the first randomly generated motion artifact and the second randomly generated motion artifact respectively comprised in the first MR training image and the second MR training image of each pair of obtained MR training images are computed-simulated.

* * * * *